(12) United States Patent
Kuroda

(10) Patent No.: US 9,214,418 B2
(45) Date of Patent: Dec. 15, 2015

(54) LEAD FRAME WITH RADIATOR PLATE, METHOD FOR MANUFACTURING LEAD FRAME WITH RADIATOR PLATE, SEMICONDUCTOR DEVICE, AND METHOD FOR MANUFACTURING SEMICONDUCTOR DEVICE

(71) Applicant: TOYOTA JIDOSHA KABUSHIKI KAISHA, Toyota-shi, Aichi-ken (JP)

(72) Inventor: Tomohiro Kuroda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/635,319

(22) Filed: Mar. 2, 2015

(65) Prior Publication Data

US 2015/0270204 A1    Sep. 24, 2015

(30) Foreign Application Priority Data

Mar. 18, 2014  (JP) ................................. 2014-054403

(51) Int. Cl.

| | |
|---|---|
| *H01L 23/495* | (2006.01) |
| *H01L 21/52* | (2006.01) |
| *H01L 21/56* | (2006.01) |
| *H01L 21/60* | (2006.01) |

(52) U.S. Cl.
CPC .......... *H01L 23/49568* (2013.01); *H01L 21/52* (2013.01); *H01L 21/56* (2013.01); *H01L 23/49575* (2013.01); *H01L 2021/60* (2013.01)

(58) Field of Classification Search
CPC ................... H01L 23/49575; H01L 23/49568; H01L 21/56; H01L 21/52; H01L 2021/60
See application file for complete search history.

(56) References Cited

U.S. PATENT DOCUMENTS

| | | | |
|---|---|---|---|
| 2009/0051052 A1 | 2/2009 | Yoshioka et al. | |
| 2013/0154068 A1* | 6/2013 | Sanchez | H01L 23/4334 257/675 |
| 2014/0003013 A1* | 1/2014 | Yoo | H01L 25/072 361/767 |

FOREIGN PATENT DOCUMENTS

| | | |
|---|---|---|
| JP | 2009-010208 A | 1/2009 |
| JP | 2009-049298 A | 3/2009 |

* cited by examiner

*Primary Examiner* — Ahmed Sefer
(74) *Attorney, Agent, or Firm* — Oliff PLC

(57) ABSTRACT

A lead frame with a radiator plate on which a semiconductor chip 50 is to be mounted is provided with a radiator plate 30, and a lower surface side lead frame 40 including an upper surface 41 and a lower surface 42. The lower surface side lead frame 40 overlaps and fixes the radiator plate 30 with the lower surface 42 making contact with the radiator plate 30. A through hole 43 piercing the lower surface side lead frame 40 from the upper surface 41 to the lower surface 42 is formed at a position where the lower surface side lead frame 40 overlaps the radiator plate 30, and an opening area of the through hole 43 at the lower surface 42 is larger than an opening area of the through hole 43 at the upper surface 41.

8 Claims, 11 Drawing Sheets

LEAD FRAME WITH RADIATOR PLATE, METHOD FOR MANUFACTURING LEAD FRAME WITH RADIATOR PLATE, SEMICONDUCTOR DEVICE, AND METHOD FOR MANUFACTURING SEMICONDUCTOR DEVICE

CROSS-REFERENCE TO RELATED APPLICATION

This application claims priority to Japanese Patent Application No. 2014-054403 filed on Mar. 18, 2014, the contents of which are hereby incorporated by reference into the present application.

TECHNICAL FIELD

The present application relates to a lead frame with a radiator plate, a method for manufacturing a lead frame with a radiator plate, a semiconductor device and a method for manufacturing a semiconductor device.

DESCRIPTION OF RELATED ART

To date, a lead frame with a radiator plate in which the radiator plate and the lead frame are fixed to each other, has been known. Further, a semiconductor device in which a semiconductor chip is mounted on the lead frame with the radiator plate, has been known. Such a lead frame with a radiator plate and a semiconductor device are disclosed in Japanese Patent Application Publication No. 2009-010208. The lead frame with the radiator plate disclosed in Japanese Patent Application Publication No. 2009-010208 includes: a radiator plate; and a lower-surface side lead frame overlapping and fixing the radiator plate. A semiconductor chip is mounted on the radiator plate. The lower-surface side lead frame has a hole that pierces the lower-surface side lead frame from the upper surface to the lower surface. The lead frame with the radiator plate and the semiconductor chip are sealed by sealing resin. Thus, the semiconductor device in which the semiconductor chip is sealed, is provided.

In the semiconductor device disclosed in the above literature, the lead frame with the radiator plate is sealed by the sealing resin. In this case, an improvement in adhesion between the sealing resin and the lead frame with the radiator plate has been desired. Further, an improvement in the hole formed in the lead frame has been desired of its dimensional accuracy in order to enhance the adhesion.

BRIEF SUMMARY OF INVENTION

Thus, an object of the present disclosure is to provide a technique in which a through hole can be formed with high accuracy.

One aspect of the present disclosure provides a lead frame with a radiator plate on which a semiconductor chip is to be mounted. The lead frame with the radiator plate includes a radiator plate, and a lead frame comprising one surface and another surface opposite to the one surface. The lead frame overlaps and fixes the radiator plate with the other surface making contact with the radiator plate. A through hole piercing the lead frame from the one surface to the other surface is formed at a position where the lead frame overlaps the radiator plate. An opening area of the through hole at the other surface is larger than an opening area of the through hole at the one surface.

In this configuration, the lead frame and the radiator plate are formed as separate members. Therefore, the through hole having a tapered shape in which the opening area at the other surface of the lead frame is larger than the opening area at the one surface thereof, can be accurately formed.

The present disclosure also provides a method for manufacturing a lead frame with a radiator plate on which a semiconductor chip is to be mounted. The method includes forming a through hole piercing the lead frame from one surface to another surface of the lead frame so that an opening area of the through hole at the other surface is larger than an opening area of the through hole at the one surface, the other surface being opposite to the one surface. The method further includes fixing the lead frame in which the through hole is formed to the radiator plate by overlapping the lead frame and the radiator plate so that the other surface makes contact with the radiator plate and the through hole is closed by the radiator plate at the other surface.

In this configuration, since the through hole is formed in the lead frame before the lead frame and the radiator plate are fixed to each other, forming of the through hole does not become complicated, thereby facilitating easy forming of the through hole. Further, since the through hole is formed in a state where the lead frame is not fixed to the radiator plate i.e., when the lead frame is a single member, the through hole can be directly formed in one process, thereby enhancing dimensional accuracy. Consequently, a lead frame with a radiator plate in which adhesion to sealing resin is high and dimensional accuracy is high, can be easily manufactured.

DETAILED DESCRIPTION OF INVENTION

Figure 1:
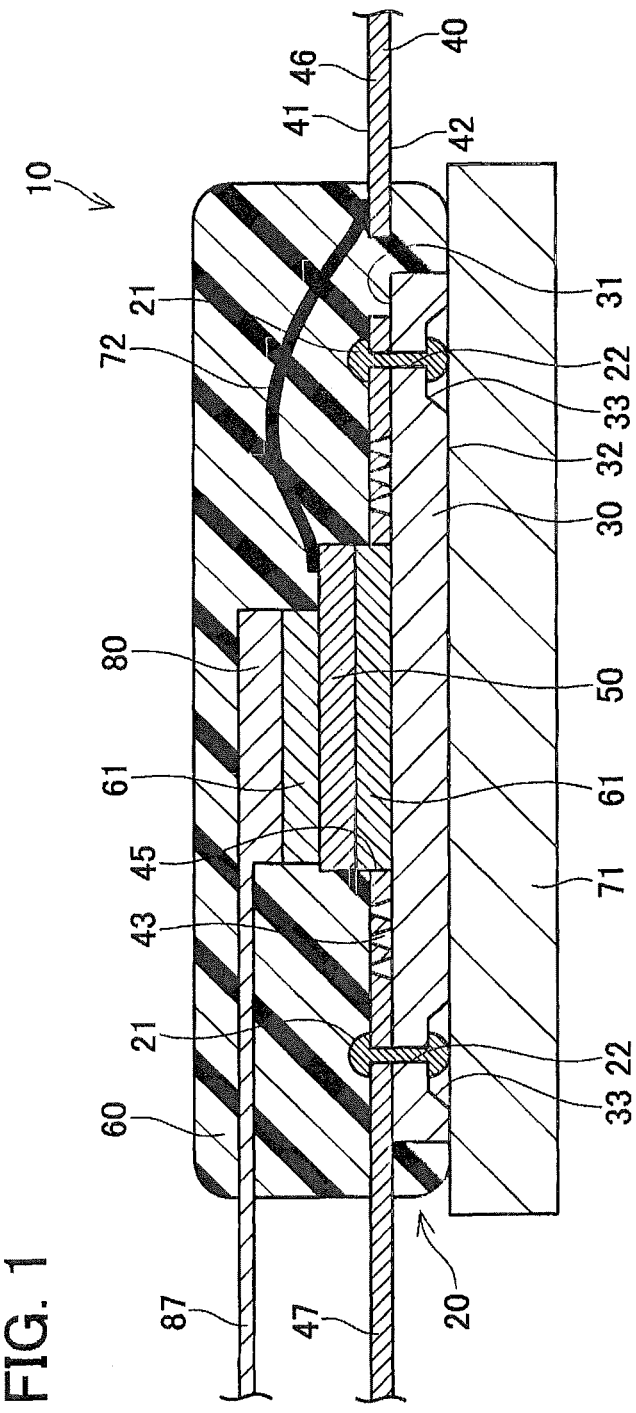
FIG. 1 is a cross-sectional view of a semiconductor device according to an embodiment.

Hereinafter, embodiments will be described with reference to accompanying drawings. A semiconductor device 10 according to one embodiment includes a semiconductor chip 50, and a lead frame 20 with a radiator plate on which the semiconductor chip 50 is mounted, as shown in FIG. 1. Further, the semiconductor device 10 includes an upper-surface side lead frame 80 fixed to the semiconductor chip 50. Further, the semiconductor device 10 includes sealing resin 60 that seals the semiconductor chip 50, the lead frame 20 with the radiator plate, and the upper-surface side lead frame 80.

The semiconductor chip 50 includes an upper surface electrode and a signal electrode that are formed on an upper surface side, and a lower surface electrode formed on a lower surface side (any of them are not shown). For example, an IGBT (Insulated Gate Bipolar Transistor), a MOSFET (Metal Oxide Semiconductor Field Effect Transistor), and the like can be used as the semiconductor chip 50. In a case where the semiconductor chip 50 is an IGBT, a trench gate, an emitter region, a collector region, and the like (which are not shown) are formed in the semiconductor chip 50. The signal electrode is used for inputting and outputting signals to and from the semiconductor chip 50. The upper-surface side lead frame 80 is fixed to the upper surface of the semiconductor chip 50. The lead frame 20 with the radiator plate is fixed to the lower surface of the semiconductor chip 50. The semiconductor chip 50 and the upper-surface side lead frame 80 are fixed by bonding member 61. The semiconductor chip 50 and the lead frame 20 with the radiator plate are fixed by the bonding member 61.

The upper-surface side lead frame 80 is formed in a flat plate shape having an upper surface (an example of "one surface") and a lower surface (an example of "another surface") opposite to the upper surface. The semiconductor chip 50 is fixed to the lower surface of the upper-surface side lead frame 80 via the bonding member 61. Solder may be used as the bonding member 61. The upper-surface side lead frame 80 has a bus bar 87 formed therein. The bus bar 87 extends laterally. The bus bar 87 is used for supplying electricity to the semiconductor chip 50.

Figure 2:
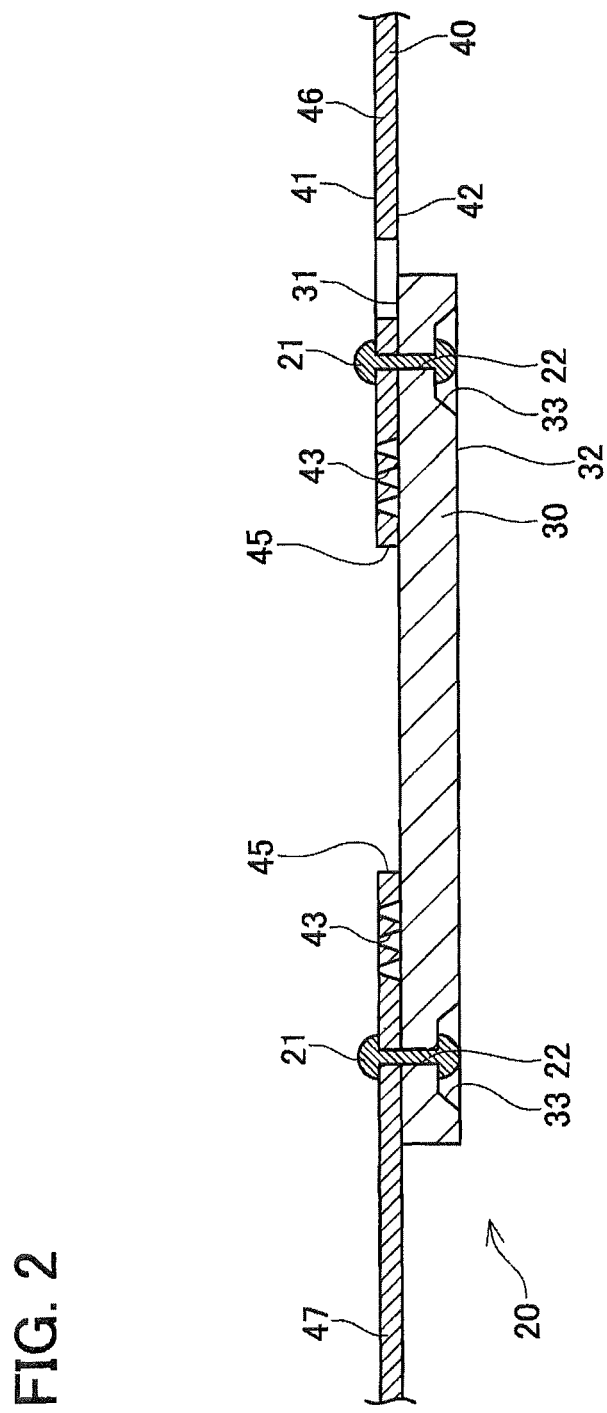
FIG. 2 is a cross-sectional view of a lead frame with a radiator plate according to the embodiment.

The lead frame 20 with the radiator plate includes a radiator plate 30, and a lower-surface side lead frame 40 overlapping and fixing the radiator plate 30, as shown in FIG. 2. Notably, the lower-surface side lead frame 40 corresponds to a lead frame recited in claims. The radiator plate 30 is formed in a plate shape having an upper surface 31 and a lower surface 32. The lower-surface side lead frame 40 is formed in a plate shape having an upper surface 41 and a lower surface 42. The upper surface 31 of the radiator plate 30 contacts the lower surface 42 of the lower-surface side lead frame 40.

The radiator plate 30 has electric conductivity and thermal conductivity. For example, a metal such as copper and aluminium can be used as a material of the radiator plate 30. As shown in FIG. 1, the semiconductor chip 50 is mounted on the radiator plate 30. The radiator plate 30 can radiate heat emitted by the semiconductor chip 50 to the outside. Further, it is possible to supply current via the radiator plate 30. The semiconductor chip 50 is fixed to the upper surface 31 of the radiator plate 30 via the bonding member 61, Solder may be used as the bonding member 61.

As shown in FIG. 1, a cooler 71 is fixed to the lower surface 32 of the radiator plate 30. The cooler 71 is in contact with the lower surface 32 of the radiator plate 30 via insulating grease (not shown). The cooler 71 has a coolant circulating inside, and can cool an object in contact with the cooler. A publicly known cooler of a water-cooled type or air-cooled type may be implemented as the cooler 71. The semiconductor chip 50 can be cooled by the cooler 71 via the radiator plate 30.

Concave portions 33 are formed on the lower surface 32 of the radiator plate 30. Caulking holes 22 are formed in the radiator plate 30 and the lower-surface side lead frame 40. Caulking members 21 are inserted into the caulking holes 22. The caulking members 21 are disposed in the concave portions 33 and the caulking holes 22. The radiator plate 30 and the lower-surface side lead frame 40 are pressurized and fixed by the caulking members 21. Thus, the radiator plate 30 and the lower-surface side lead frame 40 are integrated with each other. Fixing by caulking is a method for pressuring and fixing an object to be fixed, by pressurizing a caulking member such as a rivet.

Figure 3:
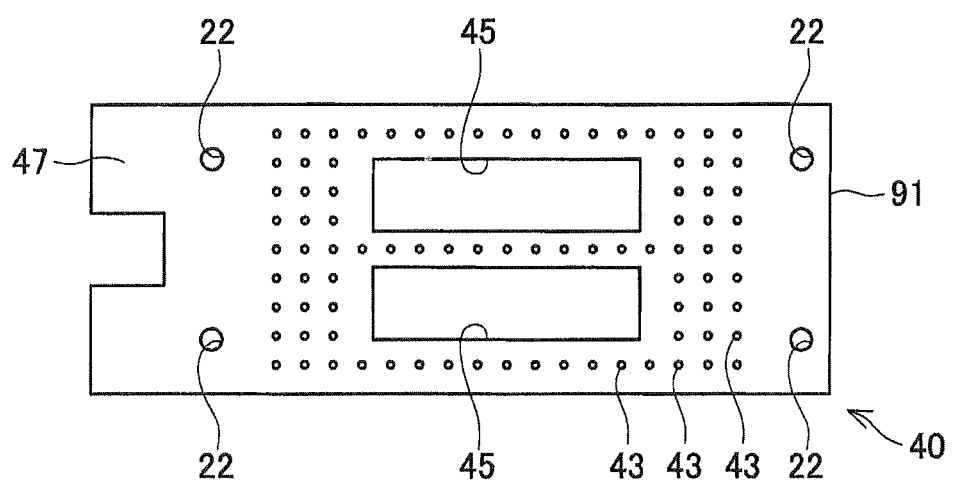
FIG. 3 is a top view of a lower-surface side lead frame.

The lower-surface side lead frame 40 has electric conductivity and thermal conductivity. A metal such as copper or aluminium for example can be used as a material of the lower-surface side lead frame 40. As shown in FIG. 3, the lower-surface side lead frame 40 has a plurality of openings 45. The plurality (two in the present embodiment) of openings 45 is formed in a center portion of the lower-surface side lead frame 40. The openings 45 are aligned adjacent to each other. Each opening 45 pierces the lower-surface side lead frame 40 from the upper surface to the lower surface. As shown in FIG. 2, the openings 45 are formed in the lower-surface side lead frame 40 at a position where the lower-surface side lead frame 40 and the radiator plate 30 overlap each other. The openings 45 are formed so as to be positioned above the upper surface 31 of the radiator plate 30. As shown in FIG. 1, the bonding member 61 is disposed in the openings 45. That is, the semiconductor chip 50 is connected to the radiator plate 30 via the bonding member 61 in the openings 45.

Figure 4:
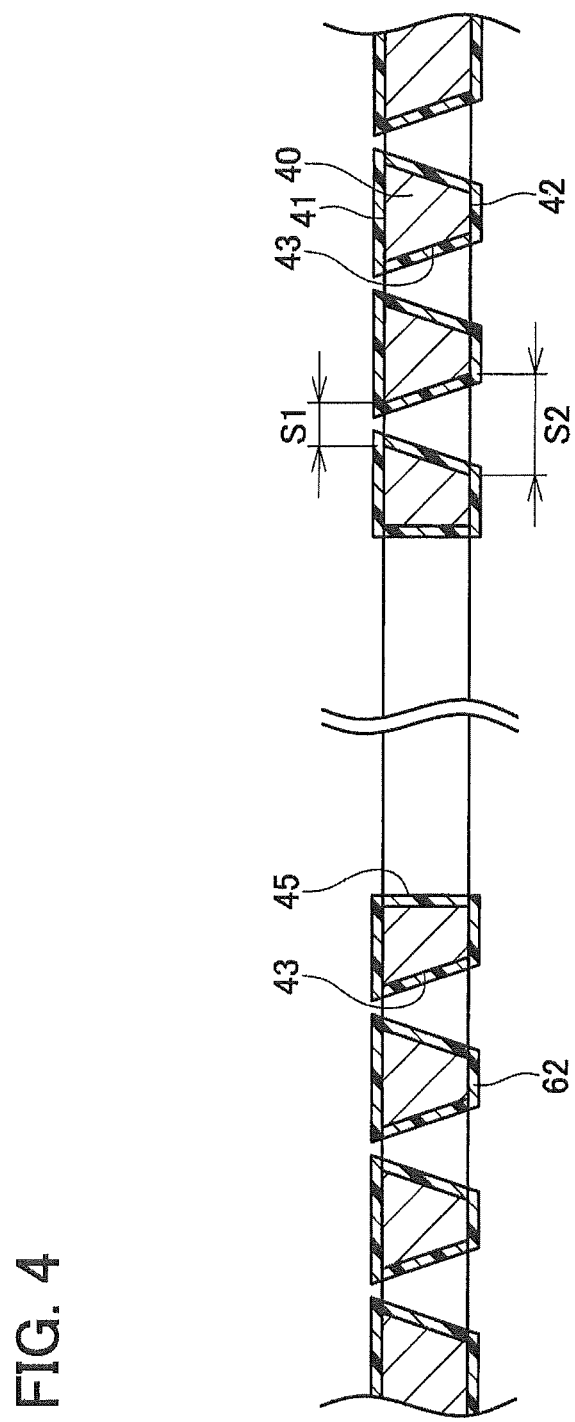
FIG. 4 is an enlarged cross-sectional view illustrating a portion of the lower-surface side lead frame.

Further, as shown in FIG. 3, the lower-surface side lead frame 40 has a plurality of through holes 43 (or dimples) s. The size of each of the plural through holes 43 is not limited to any specific size. The plurality of through holes 43 may have the same size, or may have different sizes. The through holes 43 are each formed in a circular shape in top view. The through holes 43 are formed around the openings 45. The through holes 43 are spaced from each other. The through holes 43 pierce the lower-surface side lead frame 40 from the upper surface to the lower surface. As shown in FIG. 2, the through holes 43 are formed in the lower-surface side lead frame 40 at positions where the lower-surface side lead frame 40 and the radiator plate 30 overlap each other. The through holes 43 are formed so as to be positioned above the upper surface 31 of the radiator plate 30. As shown in FIG. 4, each through hole 43 is formed such that an opening area (diameter in the present embodiment) is varied along a thickness direction (z direction) of the lower-surface side lead frame 40. An opening area S1 of each through hole 43 at the upper surface 41 of the lower-surface side lead frame 40 is less than an opening area S2 of the through hole 43 at the lower surface 42 thereof (the opening area S2 of each through hole 43 at the lower surface 42 of the lower-surface side lead frame 40 is larger than the opening area S1 of the through hole 43 at the upper surface 41 thereof). The opening area of each through hole 43 represents an cross-sectional area obtained by the through hole 43 being cut in a direction parallel to the upper and the lower surfaces of the lower-surface side lead frame 40. An inner surface of each through hole 43 is formed so as to be tapered. Further, the lower-surface side lead frame 40 has bus bars 47 formed therein. The bus bars 47 extend laterally. The bus bars 47 are used for supplying electricity to the semiconductor chip 50. The sealing resin 60 is filled in each through hole 43. Adhesion between the lower-surface side lead frame 40 and the sealing resin 60 can be enhanced due to a difference between opening areas of each through hole 43, on an upper surface 41 side and a lower surface 42 side of the lower-surface side lead frame 40.

Further, the lower-surface side lead frame 40 is subjected to primer treatment. The primer treatment is performed over the entirety of the lower-surface side lead frame 40. Primer resin 62 is applied to the inner surface of each through hole 43. The primer resin 62 enhances adhesion between the lower-surface side lead frame 40 and the sealing resin 60.

Further, as shown in FIG. 1, the semiconductor device 10 includes signal terminals 46. Notably, in FIG. 1, the number of the signal terminals 46 shown therein is one, however, the number of the signal terminals 46 provided in the semiconductor device 10 is plural. The signal terminals 46 extend laterally. The signal terminals 46 are used for inputting and outputting signals for the semiconductor chip 50. As shown in FIG. 1, the signal terminals 46 are connected to the signal electrode of the semiconductor chip 50 by bonding wires 72. One ends of the bonding wires 72 are fixed to the signal terminals 46. The other ends of the bonding wires 72 are fixed to the signal electrode of the semiconductor chip 50. The bonding wires 72 electrically connect the signal terminals 46 to the signal electrode.

The sealing resin 60 covers the semiconductor chip 50, the lead frame 20 with the radiator plate, and the upper-surface side lead frame 80. The sealing resin 60 is filled in the openings 45 and the through holes 43. Publicly known resin for sealing, such as epoxy resin, may be used as the sealing resin 60.

Figure 5:
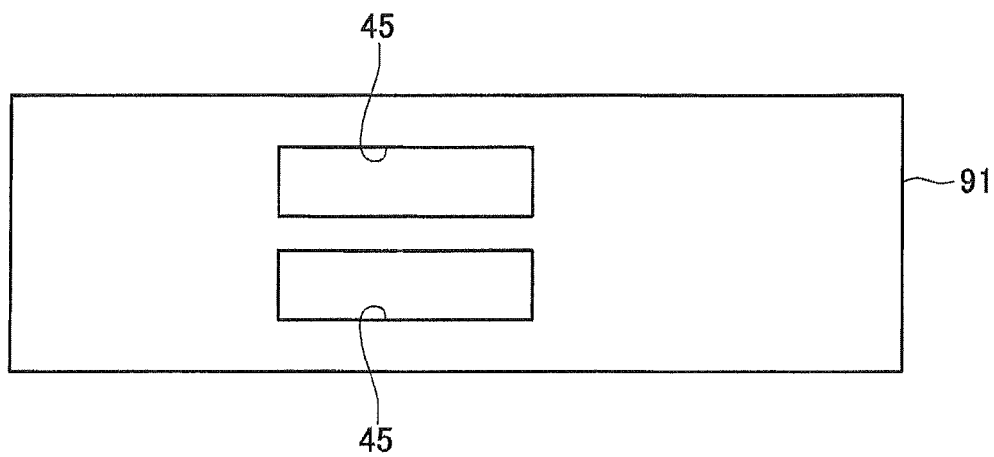
FIG. 5 illustrates a method (1) for manufacturing the semiconductor device.

Next, a method for manufacturing a semiconductor device having the above structure will be described. Firstly, a method for manufacturing a lead frame with a radiator plate which is used in the semiconductor device, will be described. In a manufacturing process of the lead frame with the radiator plate, firstly, as shown in FIG. 5, a plate-like metal member 91 is prepared, and the plurality of openings 45 are formed in the metal member 91 (openings forming process). The openings 45 are formed by, for example, press forming with use of a not-illustrated die.

Figure 6:
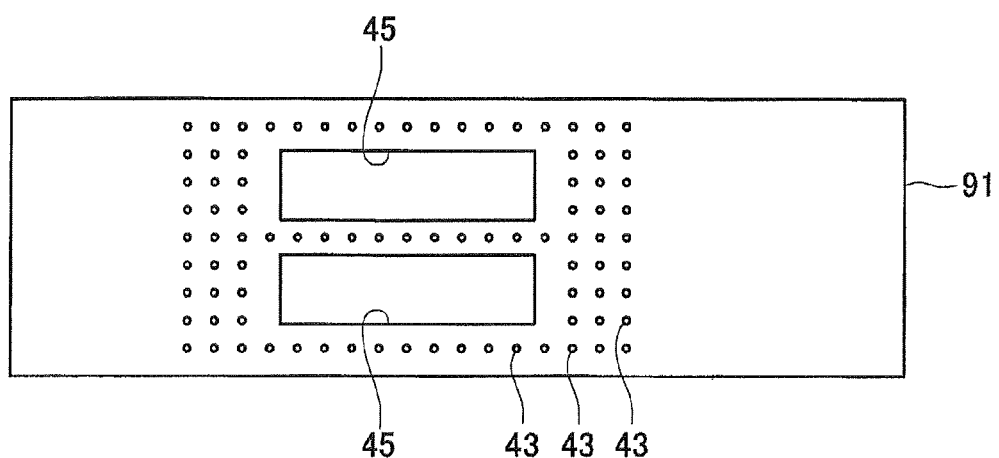
FIG. 6 illustrates the method (2) for manufacturing the semiconductor device.

Next, as shown in FIG. 6, the plurality of through holes 43 are formed in the metal member 91 (through hole forming process). The plurality of through holes 43 are formed around the openings 45. Further, the through holes 43 are formed such that, as shown in FIG. 4, the opening area S1 of each through hole 43 on the upper surface 41 side of the lower-surface side lead frame 40 is less than the opening area S2 of the through hole 43 on the lower surface 42 side thereof (the opening area S2 of each through hole 43 on the lower surface 42 side of the lower-surface side lead frame 40 is larger than the opening area S1 of the through hole 43 on the upper surface 41 side thereof). The through holes 43 may be formed before the openings 45 are formed.

Figure 7:
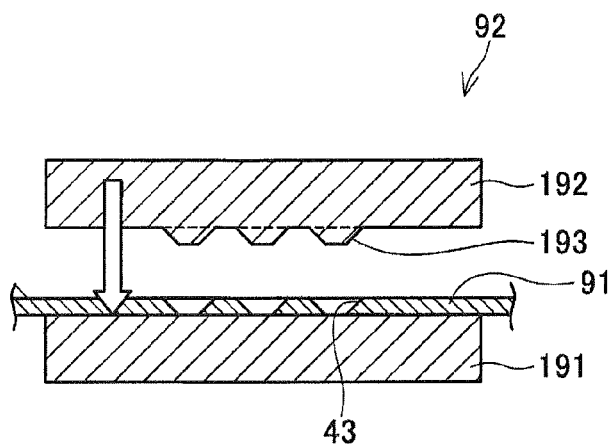
FIG. 7 illustrates a method for forming through holes.

A method for forming the through holes 43 is not limited to any specific one. In the present embodiment, as shown in FIG. 7, a die 92 is used to form the through holes 43. The die 92 includes a lower die 191 and an upper die 192. The upper die 192 includes a plurality of protrusions 193 that protrudes downward. The metal member 91 is pressed by using the die 92, whereby the through holes 43 are formed by the protrusions 193.

Figure 8:
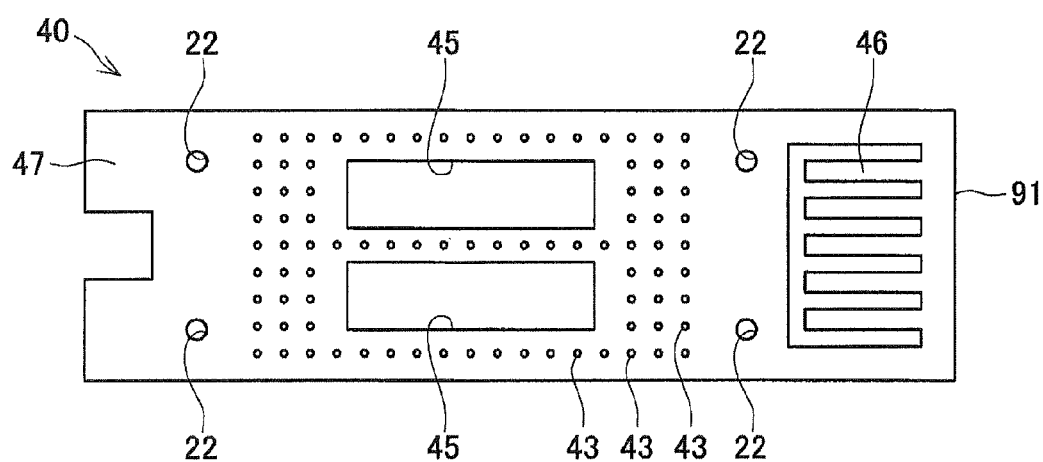
FIG. 8 illustrates the method (3) for manufacturing the semiconductor device.

Next, as shown in FIG. 8, the caulking holes 22, the signal terminals 46, and the bus bars 47 are formed in the metal member 91. The caulking holes 22, the signal terminals 46, and the bus bars 47 are formed by, for example, press forming with use of a not-illustrated die. Thus, the lower-surface side lead frame 40 is formed. At this stage, the lower-surface side lead frame 40 and each signal terminal 46 are connected with each other.

Next, the lower-surface side lead frame 40 having been formed is subjected to primer treatment (primer process). The primer treatment is performed over the entirety of the lower-surface side lead frame 40. As shown in FIG. 4, the primer resin 62 is applied to the upper surface 41, the lower surface 42, an inner surface of each opening 45, and the inner surface of each through hole 43 of the lower-surface side lead frame 40 by the primer treatment. The primer resin 62 is applied by a spin coating method. The primer resin 62 enhances adhesion between the lower-surface side lead frame 40 and the sealing resin 60.

Next, the lower-surface side lead frame 40 and the radiator plate 30 are overlapped so as to be fixed to each other by caulking (fixing process). The lower-surface side lead frame 40 and the radiator plate 30 are overlapped such that the openings 45 and the through holes 43 are positioned at positions where both the lower-surface side lead frame 40 and the radiator plate 30 overlap each other. Thus, as shown in FIG. 2, the lead frame 20 with the radiator plate is formed. In the fixing process, the through holes 43 on the lower surface 42 of the lower-surface side lead frame 40 are closed by the radiator plate 30.

Figure 9:
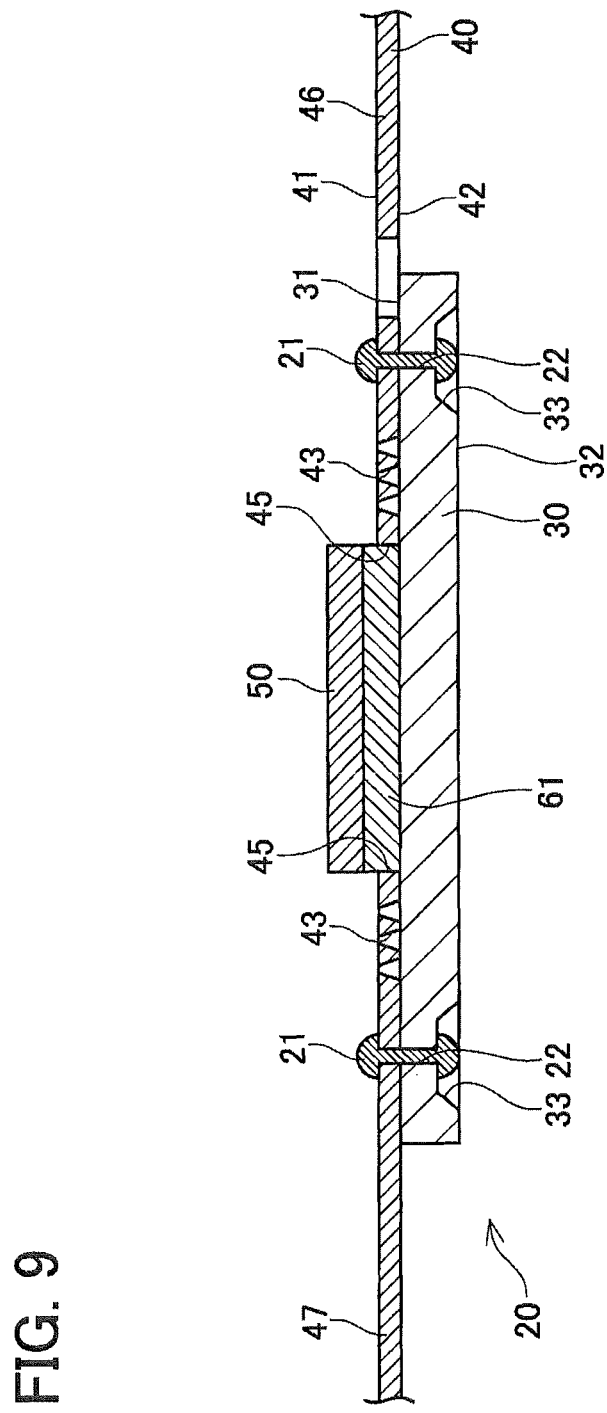
FIG. 9 illustrates the method (4) for manufacturing the semiconductor device.

Subsequently, as shown in FIG. 9, the semiconductor chip 50 is mounted on the lead frame 20 with the radiator plate (mounting process). The semiconductor chip 50 is disposed in the openings 45 of the lower-surface side lead frame 40 as viewed from thereabove. Further, the lower surface electrode of the semiconductor chip 50 is fixed to the upper surface 31 of the radiator plate 30 through the bonding member 61.

Figure 10:
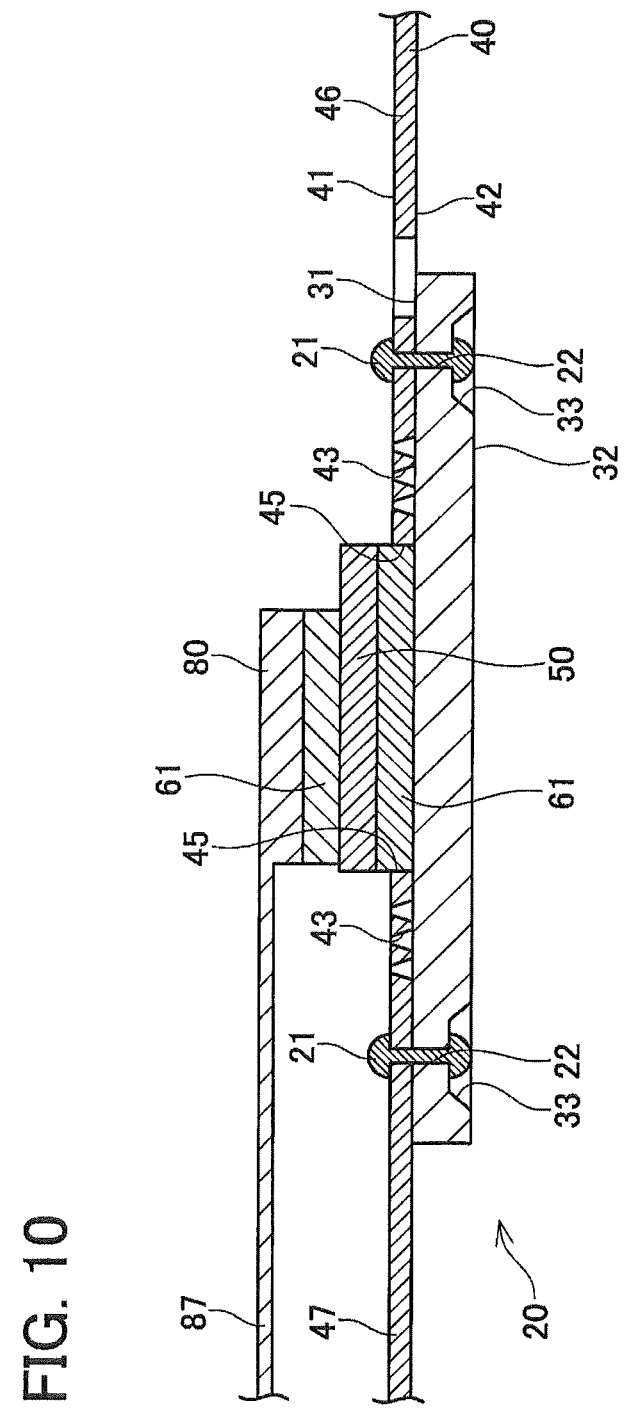
FIG. 10 illustrates the method (5) for manufacturing the semiconductor device.
Figure 11:
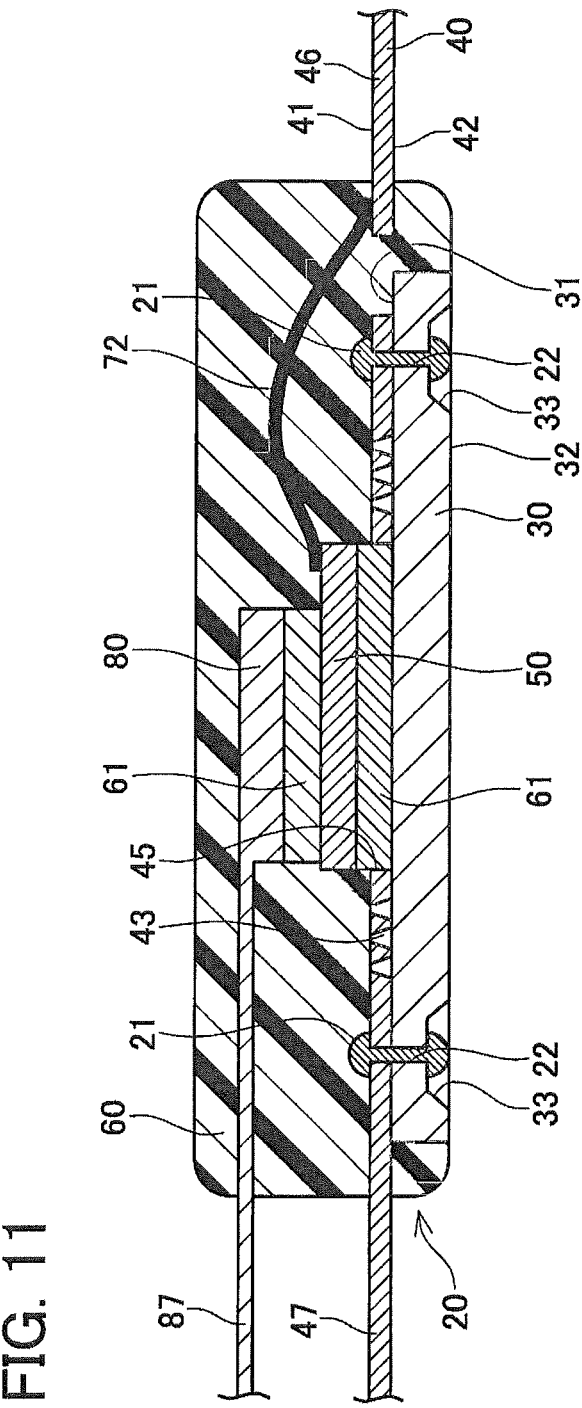
FIG. 11 illustrates the method (6) for manufacturing the semiconductor device.

Next, as shown in FIG. 10, the upper-surface side lead frame 80 is fixed to the semiconductor chip 50. The upper-surface side lead frame 80 is fixed to the upper surface electrode of the semiconductor chip 50 via the bonding member 61. Next, as shown in FIG. 11, the bonding wires 72 are fixed to the signal electrode of the semiconductor chip 50 and the signal terminals 46.

Next, the semiconductor chip 50 and the lead frame 20 with the radiator plate are sealed by the sealing resin 60 (sealing process). At this occasion, the sealing resin 60 is filled in each through hole 43. The opening area of each through hole 43 on the lower surface 42 side is larger than that on the upper surface 41 side. Therefore, the sealing resin 60 does not easily flow out through the through holes 43 on the upper surface 41 side. Further, adhesion to the sealing resin 60 is enhanced also by the primer resin 62 formed on the upper surface 41 of the lower-surface side lead frame 40, and the inner surfaces of the through holes 43 thereof. Therefore, the sealing resin 60 formed in the sealing process is less likely to be separated from the lower-surface side lead frame 40.

Next, a part of the lower-surface side lead frame 40 is cut so as to separate the signal terminals 46 from the lower-surface side lead frame 40. Finally, the cooler 71 is fixed to the lower surface 32 of the radiator plate 30, thereby obtaining the structure shown in FIG. 1. As described above, the semiconductor device 10 is manufactured.

As is apparent from the above description, the opening area of each through hole 43 on the lower surface 42 side of the lower-surface side lead frame 40 is larger than the opening area of the through hole 43 on the upper surface 41 side thereof in the lead frame 20 with the radiator plate having the above structure. Thus, when the lead frame 20 with the radiator plate is sealed by the sealing resin 60, and the sealing resin 60 is filled in each through hole 43, the sealing resin 60 is less likely to flow out from each through hole 43. Therefore, adhesion between the lead frame 20 with the radiator plate and the sealing resin 60 is enhanced. Accordingly, the lead frame 20 with the radiator plate in which adhesion to the sealing resin 60 is enhanced, and the semiconductor device 10 having the lead frame 20 with the radiator plate, can be obtained. Further, in the above manufacturing method, the through holes 43 are firstly formed in the lower-surface side lead frame 40, and thereafter the radiator plate 30, and the lower-surface side lead frame 40 having the through holes 43 are overlapped and fixed to each other. Thus, the through holes 43 are formed in the lower-surface side lead frame 40 before the lower-surface side lead frame 40 and the radiator plate 30 are fixed to each other. Therefore, a process for forming the through holes 43 does not become complicated, thereby facilitating easy forming of the through holes 43. Further, the through holes 43 are formed in a state where the lower-surface side lead frame 40 is not fixed to the radiator plate 30, i.e. when the lower surface side lead frame 40 is a single member. Therefore, the through holes 43 can be directly formed in one process, thereby enhancing dimensional accuracy. Therefore, the lead frame 20 with the radiator plate in which adhesion to the sealing resin 60 is high and the dimensional accuracy is high, and the semiconductor device 10 including the lead frame 20 with the radiator plate can be easily manufactured. Further, when the lower-surface side lead frame 40 is subjected to the primer treatment, the through holes 43 are less likely to be clogged with the primer resin 62. Therefore, the through holes 43 can be prevented from being clogged with the primer resin 62. Further, the radiator plate 30 and the lower-surface side lead frame 40 are separate members before the radiator plate 30 and the lower-surface side lead frame 40 are fixed to each other. Therefore, plating or the like for each of the radiator plate 30 and the lower-surface side lead frame 40 is facilitated. Further, the plating or the like may be performed for a desired portion only, thereby reducing cost.

Figure 12:
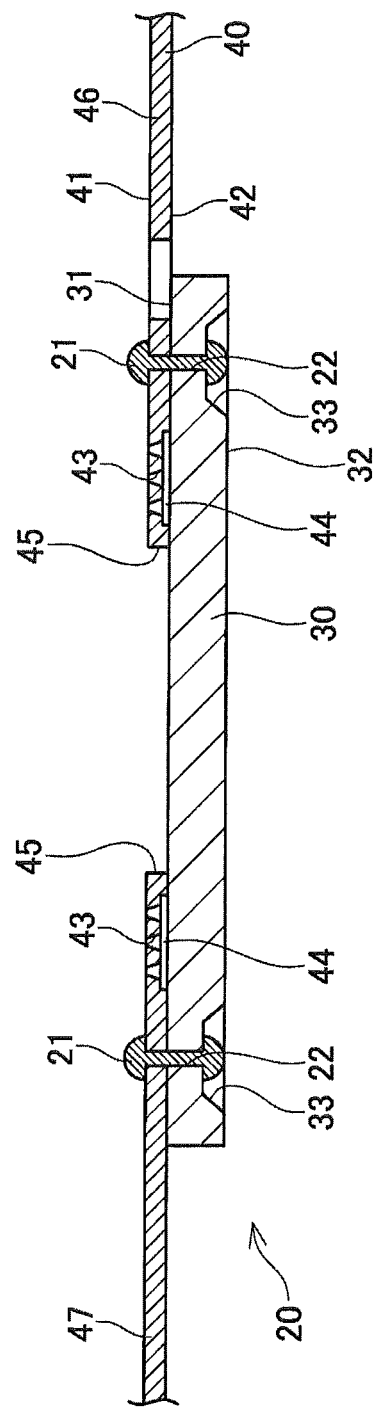
FIG. 12 is a cross-sectional view of a lead frame with a radiator plate according to another embodiment.

Although one embodiment has been described above, a specific mode is not limited to the above embodiment. It should be noted that in the following description, the same components as those described above are denoted by the same reference numerals, and the description thereof is not given. In another embodiment, as shown in FIG. 12, concave portions 44 may be formed on the lower surface 42 of the lower-surface side lead frame 40. Each of the concave portions 44 is formed below the corresponding plurality of through holes 43. The concave portion 44 communicate with the corresponding plurality of through holes 43. The concave portions 44 are formed on the lower-surface side lead frame 40 at positions where the lower-surface side lead frame 40 and the radiator plate 30 overlap each other. The concave portions 44 face the upper surface 31 of the radiator plate 30. In such a structure, adhesion between the lower-surface side lead frame 40 and the sealing resin 60 can be further enhanced by the sealing resin 60 being filled in the concave portions 44.

Figure 13:
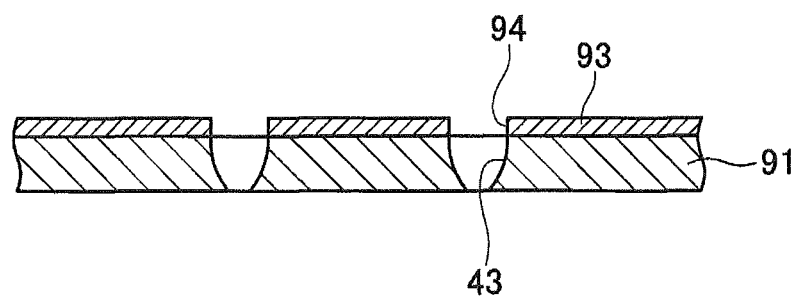
FIG. 13 illustrates a method for forming through holes according to still another embodiment.

Further, in the above embodiment, the through holes 43 are formed by press forming with the use of the die 92. However, a method for forming the through holes 43 is not limited to this method. For example, the through holes 43 may be formed by etching the metal member 91. More specifically, when the through holes 43 are formed, a mask 93 having openings 94 is formed on an upper surface of the metal member 91 as shown in FIG. 13, and etching is performed on the upper surface of the metal member 91 so as to form the through holes 43. The openings 94 of the mask 93 are formed at positions corresponding to the through holes 43.

Figure 14:
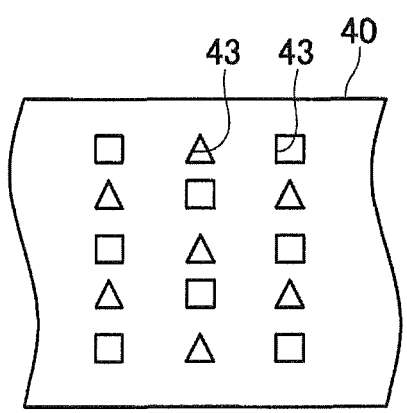
FIG. 14 is a top view illustrating a portion of a lower-surface side lead frame according to still another embodiment.
Figure 15:
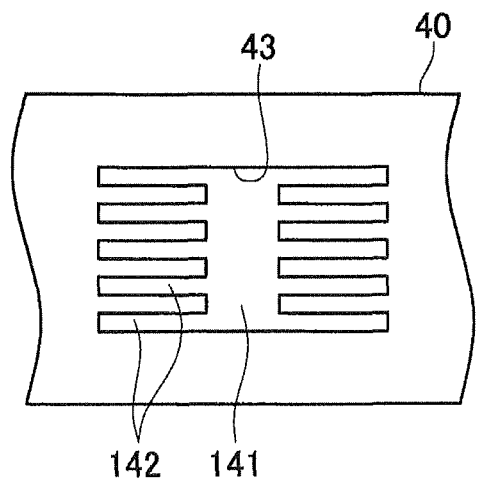
FIG. 15 is a top view illustrating a portion of a lower-surface side lead frame according to still another embodiment.

Further, in the above embodiment, each through hole 43 is formed in a circular shape in top view. However, a shape of each through hole 43 is not limited to any specific shape. In another embodiment, each through hole 43 may be formed in a polygonal shape such as a triangular shape or a quadrangular shape in top view as shown in FIG. 14. Further, the through holes 43 may be formed in a shape as shown in FIG. 15. The through hole 43 shown in FIG. 15 has a center portion 141, and a plurality of projections 142 that project laterally from the center portion 141. The center portion 141 is formed in a roughly rectangular shape. The plurality of projections 142 are aligned with a space between one another. The center portion 141 and the projections 142 communicate with each other.

Further, in the above embodiments, the radiator plate 30 and the lower-surface side lead frame 40 are fixed to each other by caulking. However, a method for fixing the radiator plate 30 and the lower-surface side lead frame 40 to each other is not limited to this method. For example, the radiator plate 30 and the lower-surface side lead frame 40 may be fixed to each other by soldering or a bonding member such as wax.

Further, in the above embodiments, the lower-surface side lead frame 40 is subjected to the primer treatment. However, the primer treatment may be omitted. Furthermore, when the lower-surface side lead frame 40 is subjected to the primer treatment, a region in which no primer treatment is required may be masked such that the primer resin 62 is not applied thereto.

Moreover, in the above embodiments, the lower-surface side lead frame 40 has a plate shape. However, a shape of the lower-surface side lead frame 40 is not limited to the above shape. The lower-surface side lead frame 40 may have a bar shape. The lower-surface side lead frame 40 having a bar shape is provided with the through holes 43. An opening area of each through hole 43 at a lower side surface (another example of another surface) of the bar-shaped lower-surface side lead frame 40 is larger than an opening area of the through hole 43 at an upper side surface (another example of one surface) thereof.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

Some of other features of the present disclosure will be listed below. It should be noted that each of the features listed below is independently useful.

1. A semiconductor device may include the above lead frame with the radiator plate. The semiconductor device may include a semiconductor chip mounted on the lead frame with the radiator plate. The semiconductor device may include sealing resin sealing the semiconductor chip and the lead frame. The sealing resin may be filled in the through hole.

2. In the semiconductor device, primer resin may be applied to an inner surface of the through hole formed on the lead frame.

3. A concave portion may be formed on the other surface at the position where the lead frame overlaps the radiator plate. The through hole may be opened on a bottom surface of the concave portion.

4. A method for manufacturing a semiconductor device may include mounting a semiconductor chip on the lead frame with the radiator plate manufactured by the above method for manufacturing a lead frame with a radiator plate.

5. The method for manufacturing the semiconductor device may comprises sealing the semiconductor chip and the lead frame by sealing resin. The sealing resin may be filled in the through hole in the sealing.

6. The method for manufacturing a semiconductor device may comprises applying primer resin to an inner surface of the through hole before the fixing.

What is claimed is:

1. A lead frame with a radiator plate on which a semiconductor chip is to be mounted, the lead frame with the radiator plate comprising:
   a radiator plate; and
   a lead frame comprising one surface and another surface opposite to the one surface,
   wherein the lead frame overlaps and fixes the radiator plate with the other surface making contact with the radiator plate, and
   a through hole piercing the lead frame from the one surface to the other surface is formed at a position where the lead frame overlaps the radiator plate, and an opening area of the through hole at the other surface is larger than an opening area of the through hole at the one surface.

2. A semiconductor device comprising:
   the lead frame with the radiator plate according to claim 1;
   a semiconductor chip mounted on the lead frame with the radiator plate; and
   sealing resin sealing the semiconductor chip and the lead frame, wherein the sealing resin is filled in the through hole.

3. The semiconductor device according to claim 2, wherein primer resin is applied to an inner surface of the through hole formed in the lead frame.

4. The semiconductor device according to claim 2, wherein
   a concave portion is formed on the other surface at the position where the lead frame overlaps the radiator plate, and
   the through hole is opened on a bottom surface of the concave portion.

5. A method for manufacturing a lead frame with a radiator plate on which a semiconductor chip is to be mounted, the method comprising:
   forming a through hole piercing the lead frame from one surface to another surface of the lead frame so that an opening area of the through hole at the other surface is larger than an opening area of the through hole at the one surface, the other surface being opposite to the one surface; and
   fixing the lead frame in which the through hole is formed to the radiator plate by overlapping the lead frame and the radiator plate so that the other surface makes contact with the radiator plate and the through hole is closed by the radiator plate at the other surface.

6. A method for manufacturing a semiconductor device, the method comprising:
   mounting a semiconductor chip on the lead frame with the radiator plate manufactured by the method according to claim 5.

7. The method for manufacturing the semiconductor device according to claim 6, the method further comprising:
   sealing the semiconductor chip and the lead frame by sealing resin,
   wherein the sealing resin is filled in the through hole in the sealing.

8. The method for manufacturing the semiconductor device according to claim 6, the method further comprising:
   applying primer resin to an inner surface of the through hole before the fixing.

* * * * *